(12) United States Patent
Ahn et al.

(10) Patent No.: US 11,201,198 B2
(45) Date of Patent: Dec. 14, 2021

(54) ELECTROLUMINESCENT DISPLAY DEVICE

(71) Applicant: LG Display Co., Ltd., Seoul (KR)

(72) Inventors: Byung-Chul Ahn, Seoul (KR); Woo-Chan Kim, Goyang-si (KR); Byeong-Sun Yoo, Goyang-si (KR); Go-Tae Kim, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/721,096

(22) Filed: Dec. 19, 2019

(65) Prior Publication Data

US 2020/0212144 A1 Jul. 2, 2020

(30) Foreign Application Priority Data

Dec. 31, 2018 (KR) .................. 10-2018-0174131

(51) Int. Cl.
*H01L 27/15* (2006.01)
*H01L 27/32* (2006.01)
*H01L 51/50* (2006.01)

(52) U.S. Cl.
CPC ........ *H01L 27/3246* (2013.01); *H01L 27/326* (2013.01); *H01L 27/3258* (2013.01); *H01L 51/5056* (2013.01); *H01L 51/5072* (2013.01)

(58) Field of Classification Search
CPC ............ H01L 27/3246; H01L 27/3258; H01L 51/5056; H01L 51/5072
See application file for complete search history.

(56) References Cited

U.S. PATENT DOCUMENTS

| | | | |
|---|---|---|---|
| 2003/0146695 A1* | 8/2003 | Seki .................... | H01L 27/3246 313/506 |
| 2018/0097050 A1* | 4/2018 | Yokota ................ | H01L 51/5215 |
| 2019/0165062 A1* | 5/2019 | Heo ..................... | H01L 51/525 |
| 2019/0334125 A1* | 10/2019 | Hosono ............... | H01L 27/3246 |

\* cited by examiner

*Primary Examiner* — Phuc T Dang
(74) *Attorney, Agent, or Firm* — Seed IP Law Group LLP

(57) ABSTRACT

Display devices and, in particular, electroluminescent display devices including a lower structure of a bank causing a highly conductive hole injection layer to take on a shape so as to reduce a leakage current, and a method for manufacturing the same are described. An electroluminescent display device includes a substrate having a plurality of pixels, a bank located at a boundary between the subpixels, a first electrode in each subpixel, a separation induction layer between the bank and the first electrode, a p-type layer with a first portion on the bank and a second portion on an emission assembly of the subpixels, and at least one common layer on the p-type layer.

19 Claims, 12 Drawing Sheets

ELECTROLUMINESCENT DISPLAY DEVICE

CROSS-REFERENCE TO RELATED APPLICATION(S)

This application claims the benefit of Korean Patent Application No. 10-2018-0174131, filed on Dec. 31, 2018, which is hereby incorporated by reference as if fully set forth herein.

BACKGROUND

Technical Field

The present disclosure relates to display device, and more particularly, to an electroluminescent display device which includes a lower structure of a bank causing a highly conductive p-type layer to take on a shape so as to reduce a leakage current.

Description of the Related Art

As we have recently entered the information age, the field of displays which visually display electrical information signals has been rapidly developed and, in order to satisfy such development, various flat display devices having excellent performance, which are thin, are lightweight, have low power consumption, or a combination of these features, are being developed and rapidly replacing conventional cathode ray tubes (CRTs).

As examples of flat display devices, there are a liquid crystal display (LCD), a quantum dot (QD) display, a field emission display (FED), an organic light emitting diode (OLED) display, etc.

Thereamong, in order to achieve compactness and clear color display without separate light sources, an electroluminescent display device is considered as a competitive application.

Such an electroluminescent display device may include organic light emitting diodes that are independently driven according to respective subpixels, and each organic light emitting diode includes an anode, a cathode and a plurality of organic layers provided between the anode and the cathode.

The organic layers include a hole injection layer, a hole transport layer, an organic emission layer and an electron transport layer that are sequentially stacked on the anode. The organic emission layer, in which holes and electrons are combined, forms excitons that emit light as energy of the excitons is lowered to a ground state. Other layers have a function of assisting transport of holes or electrons to the organic emission layer.

Further, in the electroluminescent display device, in order to display colored light, the subpixels are divided into red, green and blue subpixels, and an organic emission layer of a color corresponding to each subpixel is formed in the corresponding subpixel. In general, the organic emission layer is formed using a deposition method including a shadow mask.

The shadow mask is applied to a large-scale display device. Sagging of the shadow mask occurs due to the load of the shadow mask and thereby when the shadow mask is used several times a yield is lowered. Therefore, the organic layers, except for the emission layer, are continuously formed in common throughout the respective subpixels without disconnection.

However, due to the common layers provided in the subpixels, current flows to a side part of the electroluminescent display device through the common layers, which are planarly continuously provided, may cause side leakage current. For example, the common layers may include the hole injection layer, the hole transport layer and the electron transport layer.

In the electroluminescent display device including the organic layers provided in common as the common layers without distinction of the subpixels, when a blue subpixel of a low gray scale is turned on, a red subpixel adjacent thereto is also turned on. That is, an adjacent subpixel is turned on due to current leaked to the side part of the electroluminescent display device through the common layers as well as a vertical electric field between the anode and the cathode of the turned-on blue subpixel, which means that an adjacent subpixel may turn on due to this side leakage when instead the adjacent subpixel should be off.

Such side leakage current is mainly generated in, for example, display of a low gray scale. The reason for this is that current flowing to the organic layers provided in common due to side leakage current flowing horizontally in the blue subpixel performs a similar action to turning-on of an adjacent red subpixel in an off state.

Driving voltage required to turn on the red subpixel is lower than driving voltage required to turn on the blue subpixel. Thus, the driving voltage applied to the blue subpixel may turn on both the blue subpixels and one or more adjacent red subpixels even though a weak leakage current occurs, but the turning-on of the adjacent red subpixels is not desirable.

For example, color mixture occurs in display of a low gray scale due to turning-on of other colored subpixels caused by such side leakage current. Thus, display of a desired color may not be normally achieved.

BRIEF SUMMARY

Accordingly, the present disclosure is directed to an electroluminescent display device and a method for manufacturing the same that substantially obviate one or more problems due to limitations and disadvantages of the related art.

In various embodiments, the present invention provides an electroluminescent display device that includes a lower structure of a bank causing an organic layer to take on a shape to be in direct contact with a first electrode so as to reduce a leakage current.

Additional advantages, objects, and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the drawings.

To achieve these objects and other advantages and in accordance with the purpose of the disclosure, as embodied and broadly described herein, an electroluminescent display device includes a substrate having a plurality of subpixels, a bank located at a boundary between the subpixels and configured to expose an emission portion (which may also be referred to herein as an emission part) of each subpixel, a first electrode provided in each subpixel, a separation induction layer located between the bank and the first electrode and configured to vertically space a lower end of the bank adjacent to the emission part apart from an upper surface of the first electrode, a p-type layer located on an upper surface of the bank and the emission part and separated at the lower end of the bank, and at least one common layer provided on the p-type layer.

The at least one common layer may include a hole transport layer, an electron transport layer and a second electrode.

The electroluminescent display device may further include at least one organic emission layer disposed between the hole transport layer and the electron transport layer and divided according to the respective subpixels.

The at least one organic emission layer may include a plurality of organic emission layers, and the electroluminescent display device may further include a charge generation layer located between the organic emission layers.

The p-type layer on the bank may be spaced apart and electrically isolated from the first electrode.

The p-type layer may include 5 wt % or less of a p-type dopant with respect to a hole transporting material.

The separation induction layer may be an inorganic insulating film.

The inorganic insulating film may include at least one of SiNx, SiOx, or SiOxNy.

The separation induction layer may have an edge corresponding to an edge of the first electrode, in an area overlapping the bank.

The separation induction layer may pass between adjacent first electrodes and overlaps with edges of adjacent first electrodes, in the area overlapping the bank.

The electroluminescent display device may further include a non-display area disposed in an edge area of the substrate, and the electron transport layer may have an extension configured to cover at least one side part of the bank so as to be disposed in an open region of the bank located in the non-display area.

The extension of the electron transport layer may contact with the second electrode in the open region of the bank, and an extended part of the second electrode from the electron transport layer may contact with an electrode connection pattern in the open region of the bank.

The electrode connection patterns may be located in the same layer as the first electrode.

An extension of the hole transport layer may be located inside the extension of the electron transport layer in the non-display area, and an edge of the extension of the hole transport layer may not overlap the open region of the bank in the non-display area.

A thickness of the separation induction layer may be 1.2 times to 4 times a thickness of the p-type layer.

The separation induction layer may be disposed inside an edge of the lower end of the bank by a width of 100 Å or more.

In another aspect of the present disclosure, a method for manufacturing an electroluminescent display device includes forming a first electrode on a substrate, depositing a separation induction layer forming material on the substrate including the first electrode, forming a bank by applying a bank material on the separation induction layer forming material and patterning the bank material, and forming a separation induction layer by selectively removing the separation induction layer forming material from a region inside the bank.

The separation induction layer forming material may have higher etch selectivity ratio than that of the bank material.

It is to be understood that both the foregoing general description and the following detailed description of the present disclosure are exemplary and explanatory and are intended to provide further explanation of the disclosure as claimed.

BRIEF DESCRIPTION OF THE SEVERAL VIEWS OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure. In the drawings.

DETAILED DESCRIPTION

Figure 1:
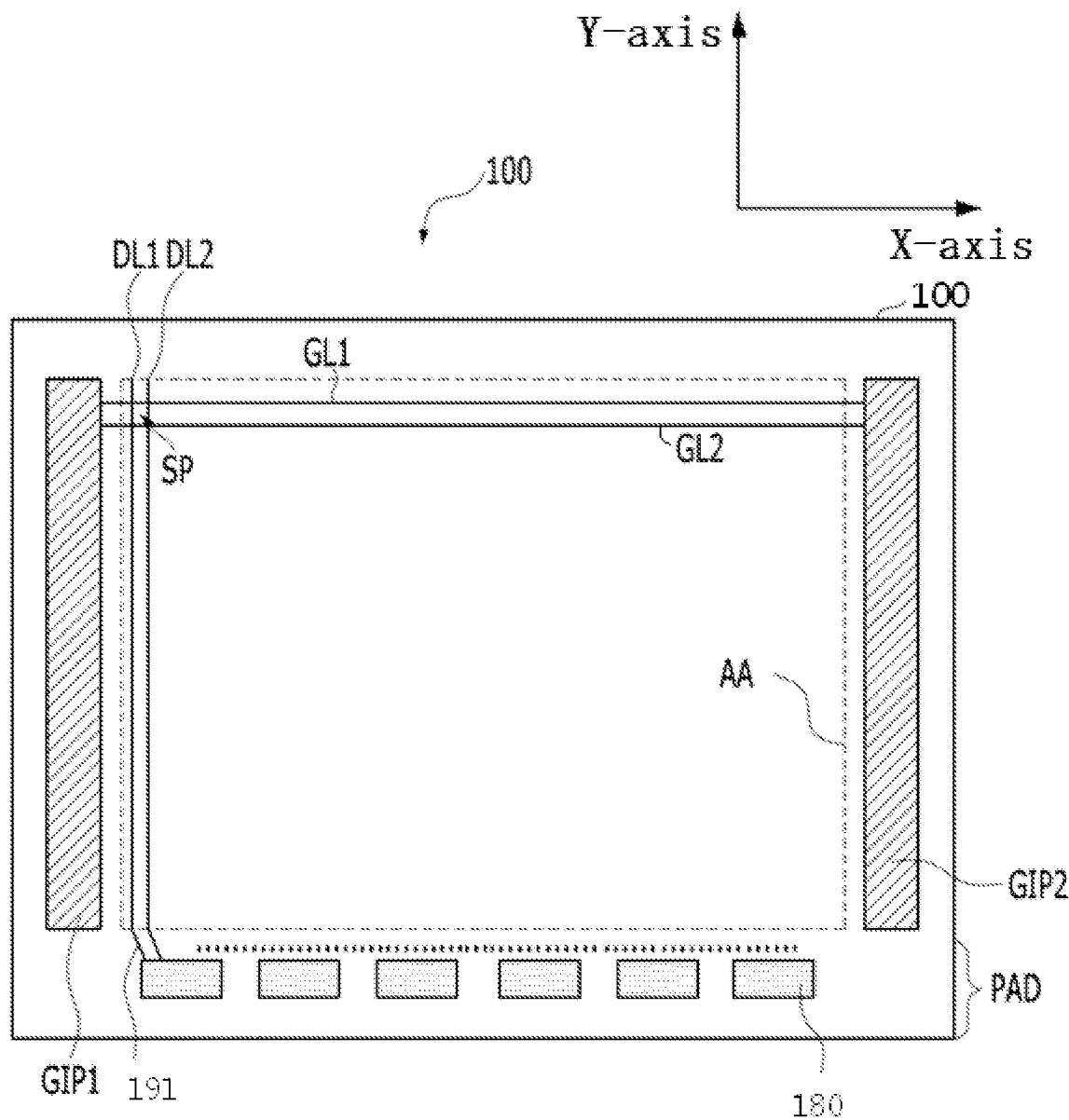
FIG. 1 is a plan view illustrating an electroluminescent display device in accordance with the present disclosure.

Reference will now be made in detail to the preferred embodiments of the present disclosure, examples of which are illustrated in the accompanying drawings. In the following description of the embodiments, the names of elements are selected in consideration of ease in preparation of a specification and may thus differ from the names of parts of an actual product.

Shapes, sizes, rates, angles, numbers, etc., disclosed in the drawings to describe the embodiments of the present disclosure are only exemplary and do not limit the present disclosure. In the following description of the embodiments and the drawings, the same or similar elements are denoted by the same reference numerals even though they are depicted in different drawings. In the following description of the embodiments of the present disclosure, a detailed description of known functions and configurations incorporated herein will be omitted when it may make the subject matter of the present disclosure rather unclear. In the following description of the embodiments, the terms 'including', 'having', 'comprising', etc., will be interpreted as indicating presence of one or more other characteristics, numbers, steps, operations, elements or parts stated in the specification or combinations thereof, and do not exclude presence of characteristics, numbers, steps, operations, elements, parts or combinations thereof, or possibility of adding the same, unless the term 'only' is used. It will be understood that a singular expression includes a plural expression unless stated otherwise.

In interpretation of elements included in the various embodiments of the present disclosure, it will be interpreted that the elements include error ranges even if there is no clear statement.

In the following description of the embodiments, it will be understood that, when positional relations are expressed, for example, when an element is 'on', 'above', 'under', 'beside', etc., another element, the two elements may directly contact each other, or one or more other elements may be interposed between the two elements unless the term 'immediately' or 'directly' is used.

In the following description of the embodiments, it will be understood that, when temporal relations are expressed, for example, a term expressing a sequence of events, such as 'after', 'subsequent to', 'next to' or 'before' may encompass continuous relationship between the events, or discontinuous relationship between the events unless the term 'immediately' or 'directly' is used.

In the following description of the embodiments, it will be understood that, when the terms 'first', 'second', etc., are used to describe various elements, these terms are used merely to discriminate the same or similar elements. Therefore, an element modified by the term 'first' may be the same as an element modified by the term 'second' within the technical scope of the disclosure unless stated otherwise.

Characteristics of the various embodiments of the present disclosure may be partially or entirely connected to or combined with each other and technically variously driven and interlocked with each other, and the various embodiments may be independently implemented or be implemented together in connection with each other.

FIG. 1 is a plan view illustrating an electroluminescent display device in accordance with the present disclosure.

As exemplarily shown in FIG. 1, the electroluminescent display device in accordance with the present disclosure may include a substrate 100 having an active area AA including a plurality of subpixels SP and a non-display area NA at the outside of the active area, a plurality of first lines GL1, GL2 and a plurality of second lines DL1, DL2 intersecting each other in the active area AA, and embedded gate-in-panel parts GIP1, GIP2 provided at at least one side of the non-display area NA and conductively connected to the first lines GL1, GL2 to sequentially supply a gate driving signal to the first lines GL1, GL2.

The subpixels SP are defined as areas formed between the first lines GL1, GL2 and the second lines DL1, DL2. The first lines GL1, GL2 and the second lines DL1, DL2 intersect each other.

The gate-in-panel parts GIP1, GIP2 are formed to be connected to a plurality of thin film transistors by wires together with formation of the thin film transistors in the substrate 100, and may not require separate driving chips.

FIG. 1 illustrates a state in which the gate-in-panel parts GIP1, GIP2 are provided at both sides of the non-display area NA. Such dual-type gate-in-panel parts GIP1, GIP2 provide the same gate driving signal to the same first lines GL1, GL2 from both sides thereof, and may reduce increase in load to the first lines GL, GL2 extending on the substrate 100 having a large area, as compared to a structure having a single gate-in-panel part GIP1, GIP2. As occasion demands, the dual-type gate-in-panel parts GIP1, GIP2 may be connected to odd-numbered and even-numbered first lines GL1, GL2, respectively, so that one of the dual-type gate-in-panel parts GIP1, GIP2 supplies a gate signal to the odd-numbered first lines GL1, GL3, etc., and the other of the dual-type gate-in-panel parts GIP1, GIP2 supplies gate driving voltage to the even-numbered first lines GL2, GL4, etc.

In addition, to the gate-in-panel parts GIP1, GIP2 that are present in the non-display area NA, a plurality of pads 180 are present in a PAD area of the non-display area NA. The plurality of pads 180 are coupled to data lines DL1, DL2 through electrical connections 191 that extend from the active area AA to the non-display area NA. The plurality of pads 180 may be coupled to an external device that provides a signal to data lines, which is communicated with the subpixels SP in the active area AA of the substrate 100.

A gate driver may be embedded in the gate-in-panel (GIP)-type substrate 100 and may be formed simultaneously with a process for forming a thin film transistor array, as exemplarily shown in FIG. 1, or be formed by preparing a separate driver integrated circuit (IC) mounted on a signal transmission film and connecting the signal transmission film to the substrate 100 so as to connect the driver IC to the substrate 100.

Hereinafter, electroluminescent display devices in accordance with respective embodiments of the present disclosure will be described by taking an organic light emitting display device as an example, but the present disclosure is not limited thereto.

Figure 2:
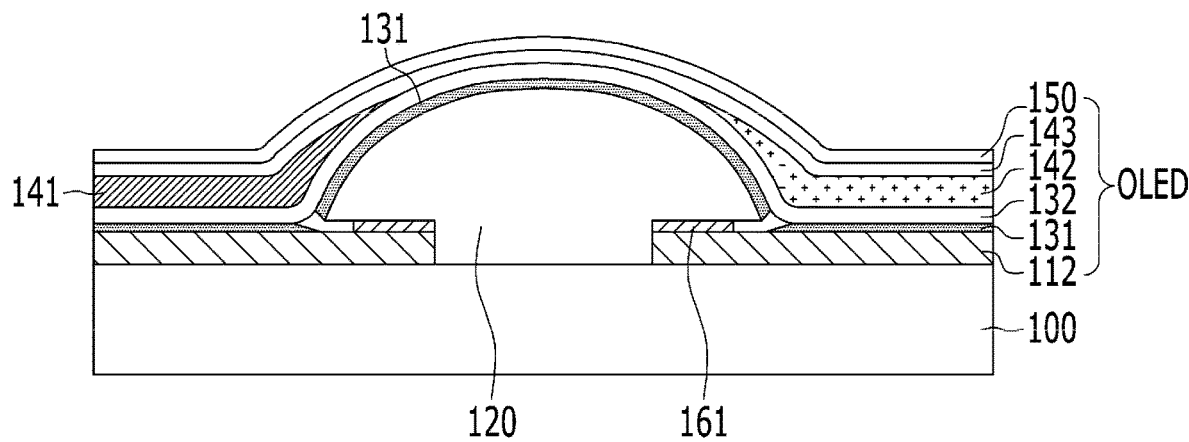
FIG. 2 is a cross-sectional view illustrating an electroluminescent display device in accordance with a first embodiment of the present disclosure.

FIG. 2 is a cross-sectional view illustrating an electroluminescent display device in accordance with a first embodiment of the present disclosure, i.e., illustrating a boundary between adjacent subpixels.

As exemplarily shown in FIG. 2, the electroluminescent display device in accordance with the first embodiment of the present disclosure may include a substrate 100 having a plurality of subpixels, a bank 120 located at a boundary between the subpixels and configured to expose an emission part of each subpixel, a first electrode 112 provided in each subpixel, a separation induction layer 161 located between the bank 120 and the first electrode 112 and configured to vertically space the lower end 157 of the bank 120 adjacent to the emission part apart from the upper surface of the first electrode 112, a p-type layer 131 located on the surface of the bank 120 and the emission part and separated at the lower end 157 of the bank 120, and at least one common layer 132, 143, 150 provided on the p-type layer 131.

Here, the 'common layer' may be formed in common at least throughout all the subpixels in an active area AA, and each common layer is formed in the entirety of the active area AA and includes an extension extending to the outside of the active area AA to partially overlap a non-display area NA.

The at least one common layer 132, 143, 150 may include a hole transport layer 132, an electron transport layer 143 and a second electrode 150 provided opposite to the first electrode 112.

In addition to the above-described layers, a hole control layer interposed between the hole transport layer 132 and an emission layer 141, 142 and an electron control layer interposed between the emission layer 141, 142 and the electron transport layer 143 may be further provided as common layers.

In the description of the embodiments of the present disclosure, the bank 120 is a pattern provided to define an area in which the emission layer emits light, for example, an emission part, and a part not provided with the bank 120 may become the emission part. Further, the bank 120 may be formed of a material having a different etch selectivity ratio from the separation induction layer 161 of the present disclosure, for example, be formed of organic matter, such as polyimide, without being limited thereto. Further, for example, the separation induction layer 161 may be formed of inorganic matter or other insulating materials having a different etch selectivity ratio from the bank 120.

The emission layer 141, 142 is provided so as to correspond to at least the emission part of each subpixel. The emission layer 141, 142 may be formed by depositing a luminescent material of a color corresponding to colored light emitted from each subpixel through a fine metal mask (FMM) provided with openings. The emission layer 141, 142 between the hole transport layer 132 and the electron transport layer 143 may be divisionally provided according to the respective subpixels. While the common layers including the hole transport layer 132, the electron transport layer 143 and the second electrode 150 are formed through a common mask provided with an opening having a greater size than the active area AA, the emission layer 141, 142 is formed through the fine metal mask provided with fine openings corresponding to the emission parts of designated subpixels and may divide areas of the subpixels from each other.

As another example, a structure in which a plurality of emission layers is stacked may be provided. A plurality of emission layers which emits light of different colors may be stacked so as to finally emit white light, or a plurality of emission layers which emits light of the same color as light emitted by a corresponding subpixel may be stacked. In order to optimally combine holes and electrons in each emission layer, the structure may further include a charge generation layer or transport layers disposed between the emission layers 141, 142.

The p-type layer 131 may include 5 wt % or less of a p-type dopant with respect to a hole transporting material and thus be a p-type. The p-type layer 131 may have a function of a hole injection layer. For example, when current is applied between the first electrode 121 and the second electrode 150 and holes flow from the first electrode 112, the p-type layer 131 may reduce interfacial resistance and facilitate hole injection at the interface between the first electrode 112 and the p-type layer 131.

The p-type layer 131 includes the p-type dopant having high conductivity and may cause leakage current in the horizontal direction if the p-type layer 131 is formed in common in the subpixels without distinction of the subpixels. Therefore, in the electroluminescent display device of the present disclosure, the p-type layer 131 is formed through a common mask in the same manner as the common layers, and causes a structure to be formed at a lower portion of the electroluminescent display device that achieves separation and isolation between the subpixels.

The separation induction layer 161 may induce separation of the p-type layer 131 between the subpixels, and be provided under the bank 120. The separation induction layer 161 is formed of a material having different etch selectivity ratio from the bank 120. Here, the bank 120 may be formed of an organic insulating material, such as benzo cyclo butane (BCB), an acrylic resin or an imide resin, and the separation induction layer 161 may be an inorganic film. For example, the separation induction layer 161 may include at least one of SiNx, SiOx, or SiOxNy, and may be formed to have a structure including a single layer formed of at least one material selected from the above group, a plurality of layers formed of the same material selected from the above group, or a plurality of layers formed of different materials selected from the above group. As another example, the separation induction layer 161 and the bank 120 may be formed of organic materials having different etch selectivity ratios. Since the separation induction layer 161 does not have electrical and optical functions in addition to a function for area separation of the p-type layer 131 primarily deposited after formation of the bank 120, the separation induction layer 161 should be deposited to have a small thickness. For example, the separation induction layer 161 may have a thickness that is 100 Å or less. Further, the separation induction layer 161 may have a width W2 that is less than the width W1 of the bank 120. The separation induction layer 161 may be formed of an inorganic insulating film that is easily formed to have the small thickness and has a different etch selectivity ratio from an organic film.

The separation induction layer 161 is formed to have a width less than the width of the lower end of the bank 120 and has an edge area at a point spaced inwardly apart from the edge of the lower end of the bank 120. Therefore, positions of the edges of the bank 120 and the separation induction layer 161 are different, and, thus, a protruding part of the lower end of the bank 120 relative to the separation induction layer 161 may be vertically spaced apart from the first electrode 112. Exposure of the lower end of the bank 120 by etching the separation induction layer 161 disposed under the bank 120 is referred to as 'undercut'.

When a p-type layer forming material is deposited under the condition that the separation induction layer 161 having a different width from the bank 120 is disposed under the bank 120, separation of the p-type layer 131 is generated at a vertically spaced region 159 between the bank 120 and the first electrode 112.

An organic light emitting diode (OLED) including the first electrode 112, the p-type layer 131, the hole transport layer 132, the emission layer 141, 142, the electron transport layer 143 and the second electrode 150, which are sequentially deposited in the vertical direction, is provided in each subpixel.

In the electroluminescent display device in accordance with the first embodiment of the present disclosure, the reason for separation of the p-type layer 131 between the subpixel areas is that the p-type layer 131 includes the p-type dopant having high conductivity and is disposed adjacent to the first electrode 112. If the p-type layer 131 is continuously disposed to be connected throughout the respective subpixels without distinction of the subpixels in the same manner as other common layers, side leakage current between the first electrodes 122 may be caused by high conductivity of the p-type layer 131. In order to prevent such a problem, the p-type layer 131 located on the upper surface of the bank 120 vertically spaced apart from the first electrode 112 and the p-type layer located on the first electrode 112 are separated from each other at the lower end of the bank 120.

The hole transport layer 132 formed subsequent to the p-type layer 131 may be continuously formed without distinction of the subpixels. Since the hole transport layer 132 is formed of a pure hole transport material, as compared to the p-type layer 131, and thus has very low conductivity, even if the hole transport layer 132 is planarly continuously formed, the hole transport layer 132 does not cause side leakage current. Further, the p-type layer 131 has a thickness of about 500 Å or less, for example, 100 Å or less, the separation induction layer 161 has a thickness which is about half to four times the thickness of the p-type layer 131 so that a vertical distance between the bank 120 and the upper surface of the first electrode 112 may be at least greater than the thickness of the p-type layer 131, and thereby, even if the p-type layer 131 is stacked on the first electrode 112 during deposition of the p-type layer 131, the p-type layer 131 on the first electrode 112 may not meet the p-type layer 131 on the bank 120. For example, a formation state of the p-type layer 131 according to a height h of the separation induction layer 161 and a width difference d between the bank 120 and the separation induction layer 161 will be described below in test examples.

Hereinafter, a method for manufacturing the electroluminescent display device in accordance with the present disclosure, for example, formation of the separation induction layer, will be described referring to the accompanying drawings.

Figure 3:
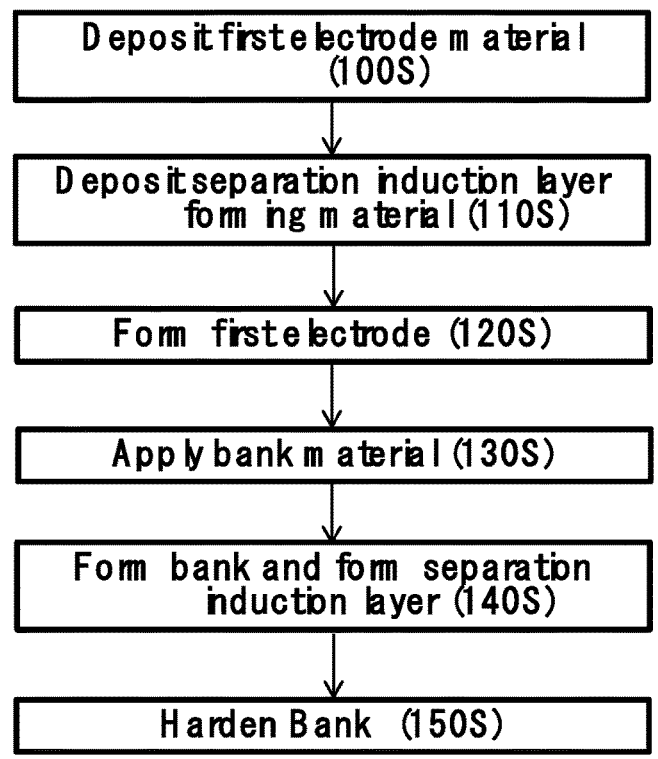
FIG. 3 is a flowchart illustrating a method for manufacturing the electroluminescent display device in accordance with the first embodiment of the present disclosure.
Figure 4A:
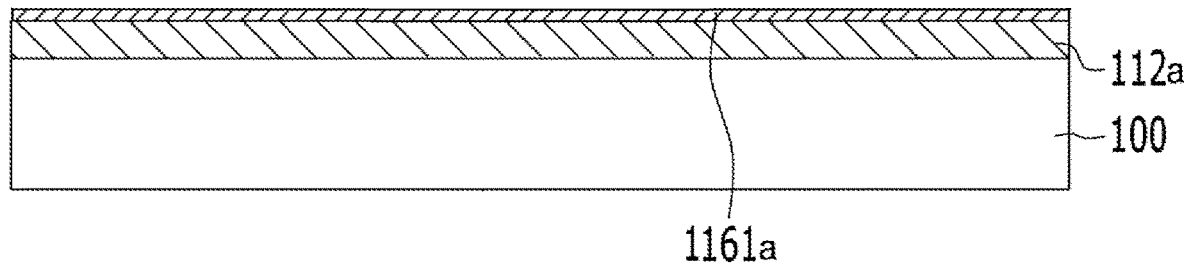
FIGS. 4A to 4C are cross-sectional views illustrating the manufacturing method in accordance with the first embodiment of the present disclosure.
Figure 4B:
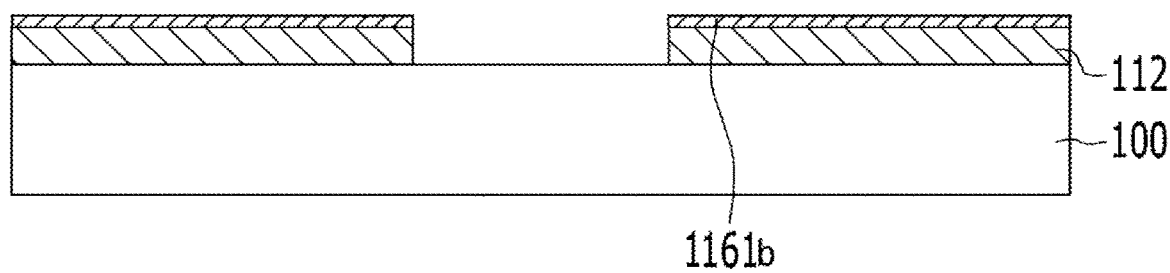
Figure 4C:
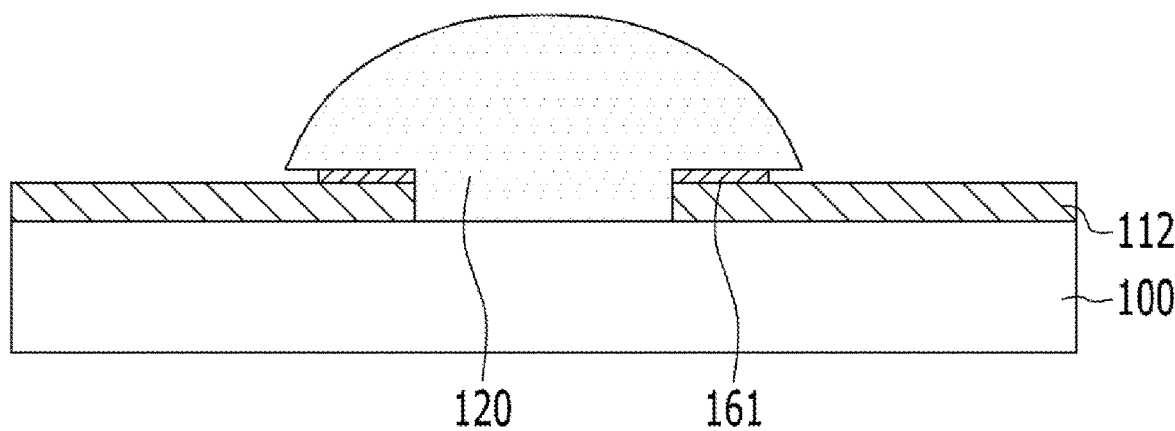

FIG. 3 is a flowchart illustrating a method for manufacturing the electroluminescent display device in accordance with the first embodiment of the present disclosure, and FIGS. 4A to 4C are cross-sectional views illustrating the manufacturing method in accordance with the first embodiment of the present disclosure.

As exemplarily shown in FIG. 3, in the electroluminescent display device in accordance with the first embodiment of the present disclosure, the first electrode 112 (referring to FIG. 2), the bank 120 and the separation induction layer 161 are formed in the following order.

First, as exemplarily shown in FIG. 4A, a first electrode material 112a and a separation induction layer forming material 1161a, which is an inorganic insulating film material, are sequentially deposited on the substrate 100 (Operations 100S and 110S).

Thereafter, as exemplarily shown in FIG. 4B, the first electrode 112 is formed by selectively removing the first electrode material 112a and the separation induction layer forming material 1161a so as to divide the first electrode material 112a and the separation induction layer forming material 1161a according to the respective subpixels (Operation 120S). An opening 113 is formed by selectively removing portions of the first electrode material 112a and the separation induction layer forming material 1161a, and the opening may be formed between subpixels SP of the plurality of subpixels SP. During such a process, a separation induction layer forming material 1161b having the same or similar width as or to the first electrode 112 remains on the first electrode 112.

Thereafter, as exemplarily shown in FIG. 4C, a bank material which is an organic film material is applied to the upper surface of the substrate 100 provided with the first electrode 112 and the separation induction layer forming material 1161b stacked thereon (Operation 130S), and is selectively removed to form the bank 120 (Operation 140S). The bank material has different etch selectivity ratio from the separation induction layer forming material 1161b. When the bank material is selectively removed, an etching solution having greater etch selectivity ratio to the separation induction layer forming material 1161b than the bank material is used, and thereby, a part of the separation induction layer forming material 1161b located at the outside of the bank 120 is removed and the other part of the separation induction layer forming material 1161b located inside the width of the lower end 157 of the bank 120 remains during the etching process. A portion of the separation induction layer forming material 1161b may be removed from between the first electrode and a lower end 157 of the bank 120 forming the vertically spaced region 159 between the bank 120 and the first electrode 112.

Thereafter, the bank 120 is hardened by heating process (Operation 150S).

In the manufacturing method in accordance with the present disclosure, the bank 120 is formed due to a difference in etch selectivity ratio between the bank material and the separation induction layer forming material, and thus the separation induction layer 161 may be formed without addition of a separate mask process.

Hereinafter, an electroluminescent display device in accordance with another embodiment of the present disclosure will be described.

Figure 5:
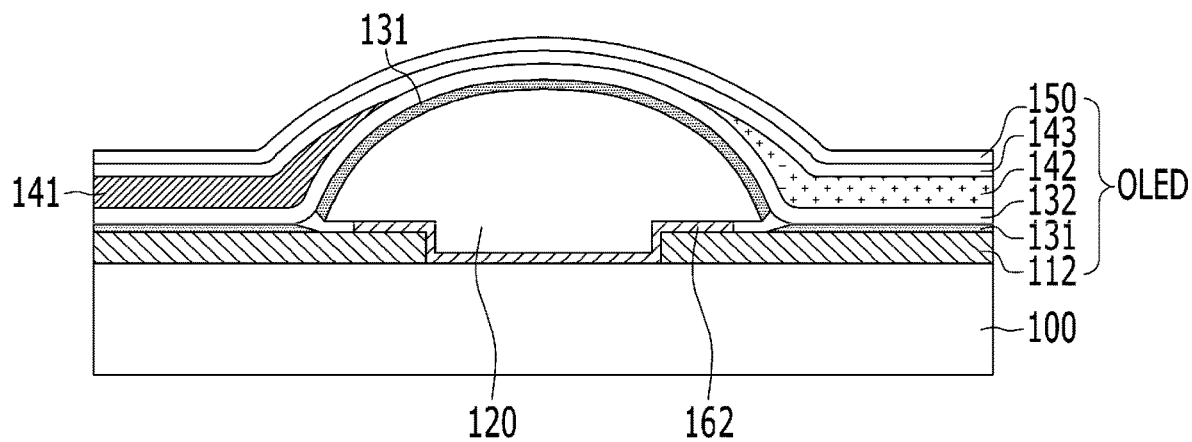
FIG. 5 is a cross-sectional view illustrating an electroluminescent display device in accordance with a second embodiment of the present disclosure.

FIG. 5 is a cross-sectional view illustrating an electroluminescent display device in accordance with a second embodiment of the present disclosure.

As exemplarily shown in FIG. 5, elements of the electroluminescent display device in accordance with the second embodiment are substantially the same as those in the first embodiment except that a separation induction layer 162 is formed to pass between subpixel areas under a bank 120. The separation induction layer 162 has a width that is less than a width of the bank 120.

Figure 6A:
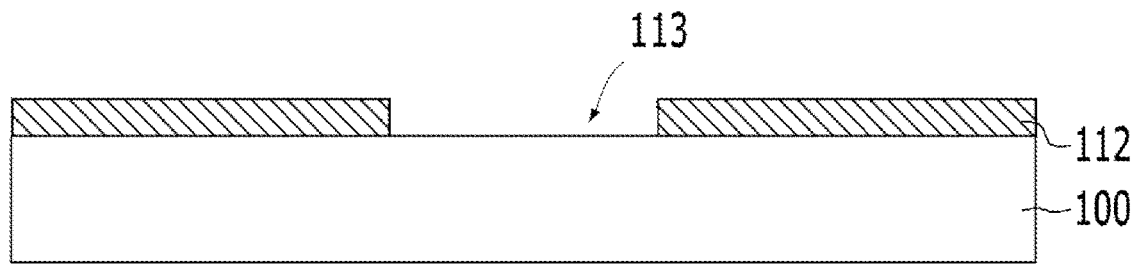
FIGS. 6A to 6C are cross-sectional views illustrating a method for manufacturing the electroluminescent display device in accordance with the second embodiment of the present disclosure.
Figure 6B:
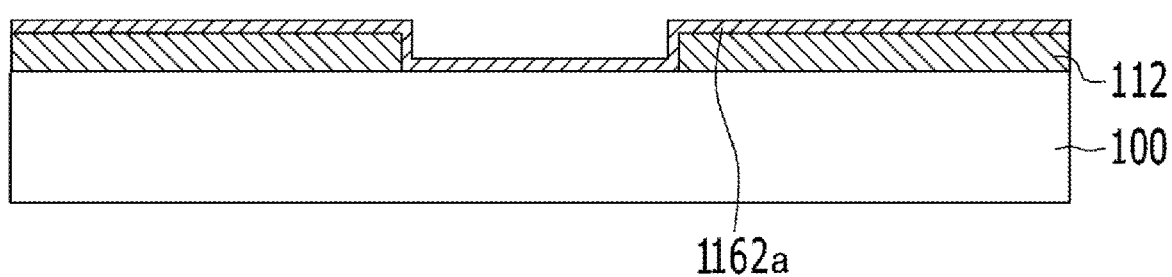
Figure 6C:
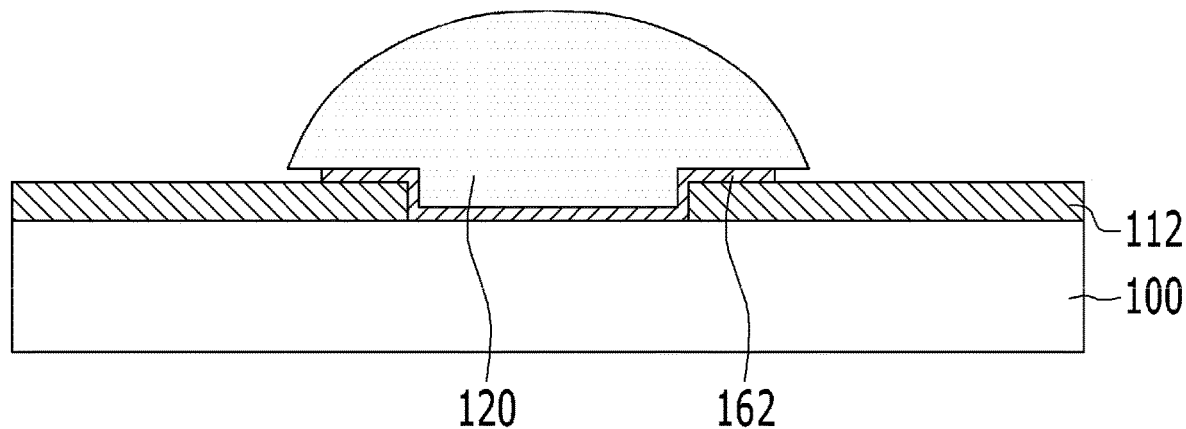

FIGS. 6A to 6C are cross-sectional views illustrating a method for manufacturing the electroluminescent display device in accordance with the second embodiment of the present disclosure.

As exemplarily shown in FIGS. 6A to 6C, in the electroluminescent display device in accordance with the second embodiment of the present disclosure, the first electrode 112 (referring to FIG. 5), the bank 120 and the separation induction layer 162 are formed in the following order.

First, as exemplarily shown in FIG. 6A, the first electrode 112 is formed by depositing a first electrode material 112a on the substrate 100 and selectively removing the first electrode material 112a. Selectively removing the first electrode material 112a forms an opening 113 positioned between first electrodes 112 that will become part of adjacent subpixels SP.

Thereafter, as exemplarily shown in FIG. 6B, a separation induction layer forming material 1162a, which is an inorganic insulating film material, is deposited on the substrate 100 including the first electrode 112. The separation induction layer forming material 1162a also fills the opening 113 positioned between first electrodes that will become part of adjacent subpixels SP.

Thereafter, as exemplarily shown in FIG. 6C, the bank 120 is formed by applying a bank material, which is an organic film material, to the upper surface of the substrate 100 provided with the first electrode 112 and the separation induction layer forming material 1162a stacked thereon and then selectively removing the bank material. The bank material has different etch selectivity ratio from the separation induction layer forming material 1162a. When the bank material is selectively removed, an etching solution having greater etch selectivity ratio to the separation induction layer forming material 1162a than the bank material is used, and thereby, a part of the separation induction layer forming material 1162a located at the outside of the bank 120 is removed, the other part of the separation induction layer forming material 1162a located inside the width of the lower end of the bank 120 remains and thus forms the separation induction layer 162 during the etching process. The separation induction layer 162 passes through a part of the upper surface of the substrate 100 not provided with the first electrode 112 formed thereon, and is formed inside the lower end of the bank 120 so as to have a constant width difference with the edge of the lower end of the bank 120.

Thereafter, the bank 120 is hardened by heating.

Hereinafter, the electroluminescent display devices having the above-described separation induction layers 161 and 162 will be examined through test examples. In the following test examples, the shape of a bank is viewed under the condition that a substrate is reversed. This means that, under the condition that a substrate is located at an upper portion of a chamber and a crucible and a deposition source are located at a lower portion of the chamber, a deposition process is actually carried out by adhering an organic material evaporated by heat applied from the crucible to the substrate.

Figure 7A:
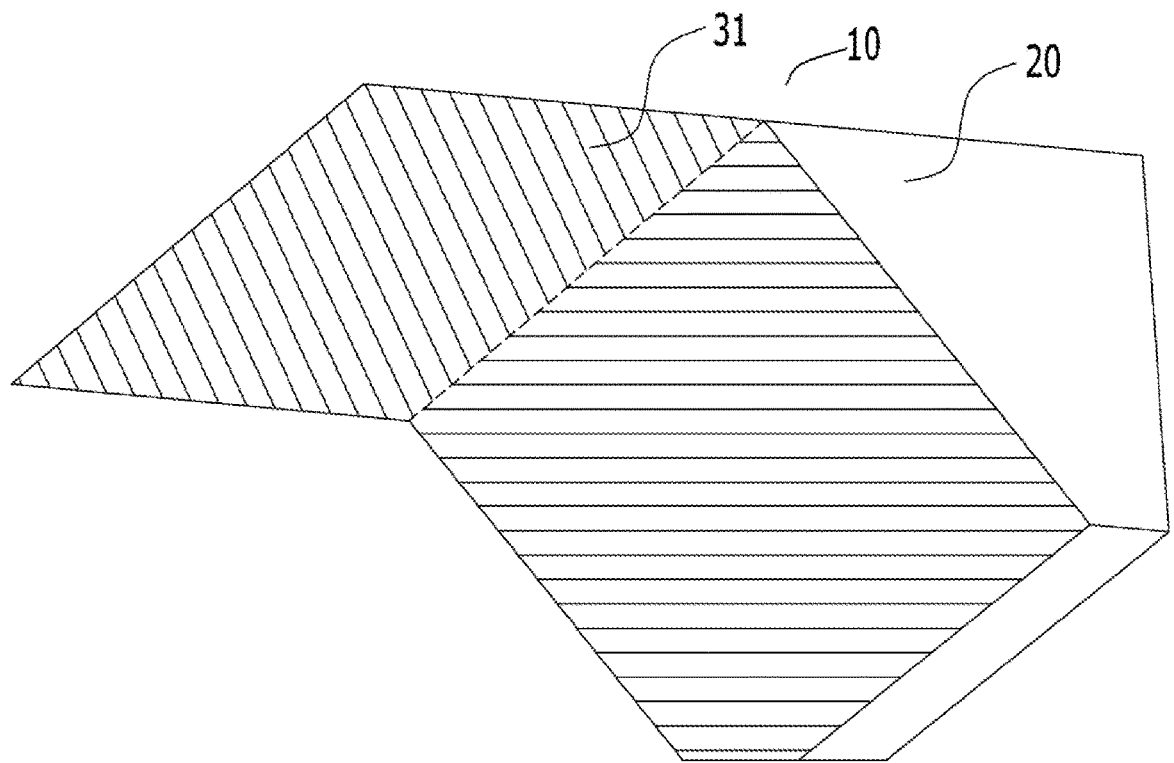
FIGS. 7A and 7B are perspective views illustrating formation states of a p-type layer on a bank in accordance with a comparative example and a bank in accordance with one embodiment of the present disclosure, respectively.
Figure 7B:
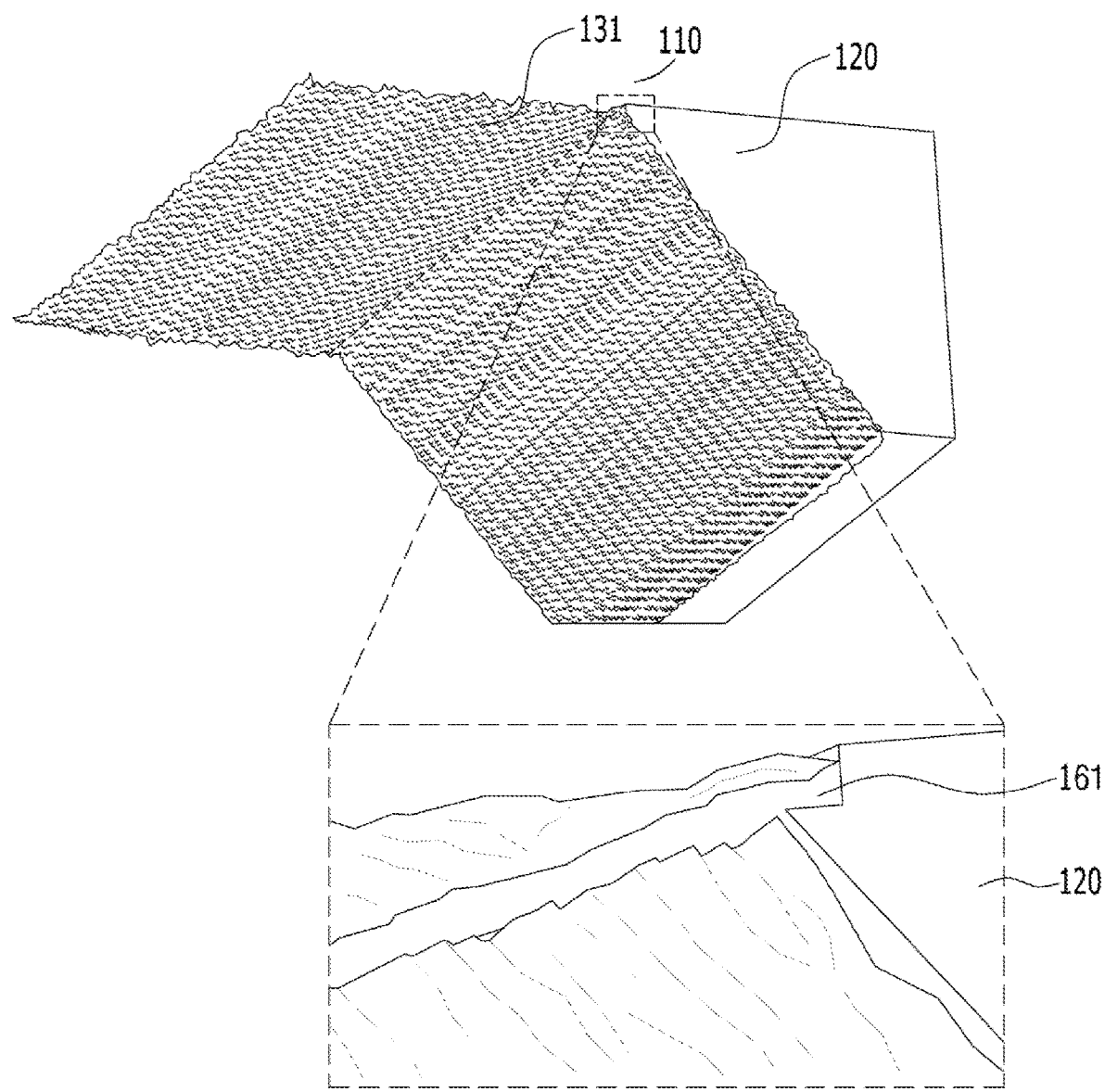

FIGS. 7A and 7B are perspective views illustrating formation states of a p-type layer on a bank in accordance with a comparative example and a bank in accordance with one embodiment of the present disclosure, respectively.

As exemplarily shown in FIG. 7A, a bank 20 of the comparative example is tapered at an acute angle with respect to the surface of a substrate 10. The bank 20 has a trapezoidal cross-section.

In this case, when a p-type layer forming organic material is deposited on the lower surface of the substrate 10, the p-type layer forming organic material is uniformly deposited on the surface of the bank 20 and an emission part not provided with the bank 20, thus forming an organic layer 31.

As exemplarily shown in FIG. 7B, in the electroluminescent display device of the present disclosure, it may be confirmed that, if the separation induction layer 161 having a lower width than the bank 120 is formed under the bank 120 so as to be located in a region aligned with a lower end of the bank 120 and then a p-type layer forming material is deposited thereon, the p-type layer 131 is formed on the surface of the bank 120 and the substrate 100 not provided with the bank 120, but the p-type layer is not formed at a part of the side surface of the separation induction layer 161.

Figure 8:
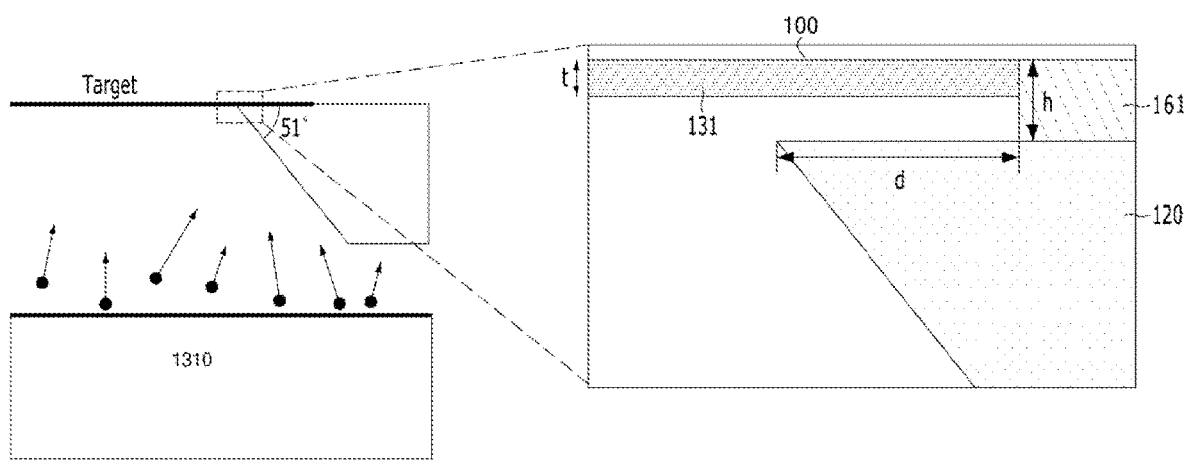
FIG. 8 is a view illustrating a p-type layer deposition process in an electroluminescent display device in accordance with the present disclosure.

FIG. 8 is a view illustrating a p-type layer deposition process in the electroluminescent display device in accordance with the present disclosure.

As exemplarily shown in FIG. 8, the p-type layer 131 may be formed by evaporating an organic material within a deposition source 1310 placed below the substrate 100 by applying heat to the organic material and depositing the evaporated organic material on the surfaces of the bank 120 and the substrate 100 not provided with the bank 120 through an outlet.

In the electroluminescent display device in accordance with the present disclosure, an edge of the separation induction layer 161 is a designated width distance d from the edge of the lower end of the bank 120 and the separation induction layer 161 is aligned with the lower end of the bank 120. The lower end of the bank 120 is vertically spaced apart from the surface of the substrate 100 by a height h of the separation induction layer 161.

In such a structure, if the p-type material is deposited to have a thickness t less than the height h of the separation induction layer 161, the p-type layer 131 may be separated between the subpixels. For example, the p-type layer 131 deposited on the surface of the bank 120 and the p-type layer 131 deposited on the substrate 100 may be separated from each other.

Hereinafter, a deposition state of the p-type layer 131 is observed by varying a height h of the separation induction layer 161a, 161b, 161c, 161d and a width difference d between the separation induction layer 161a, 161b, 161c, 161d and the bank 120 at one side of the separation induction layer 161a, 161b, 161c, 161d through tests. In each test, the p-type layer 131 is formed to have a target thickness of 80 Å. An injection angle of the p-type material from the deposition source 1310 with respect to the edge area of the substrate 100 is less than the injection angle with respect to the central area of the substrate 100, and thus, in each test example, the p-type material may be deposited close to the separation induction layer 161 under the bank 120 and the p-type layer 131 may have a large thickness. In the test examples, both the central and edge areas of the substrate 100 are represented so as to check the deposition state of the entirety of the substrate 100 in which a plurality of subpixels is disposed during the same process, deposition characteristics of the subpixels is close to deposition characteristics of the central area of the substrate 100, and deposition characteristics of the edge area of the substrate 100 correspond to deposition characteristics of the worst region of the substrate 100.

Further, the bank 120 in each test example may have a side surface inclined at an angle of 51° with the surface of the substrate 100, without being limited thereto. Also, in other alternative embodiments, the bank 120 may have a side surface at any inclined angle as desired.

Figure 9A:
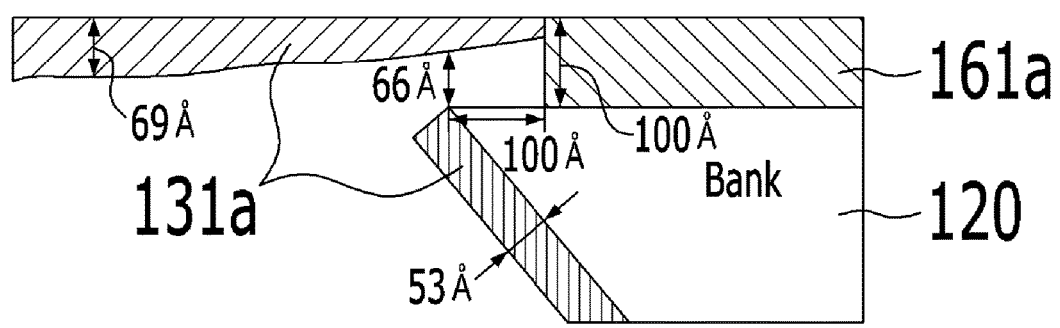
FIGS. 9A and 9B are views illustrating deposition states of a p-type layer on central and edge areas of a substrate, respectively, in an electroluminescent display device in accordance with a first test example.
Figure 9B:
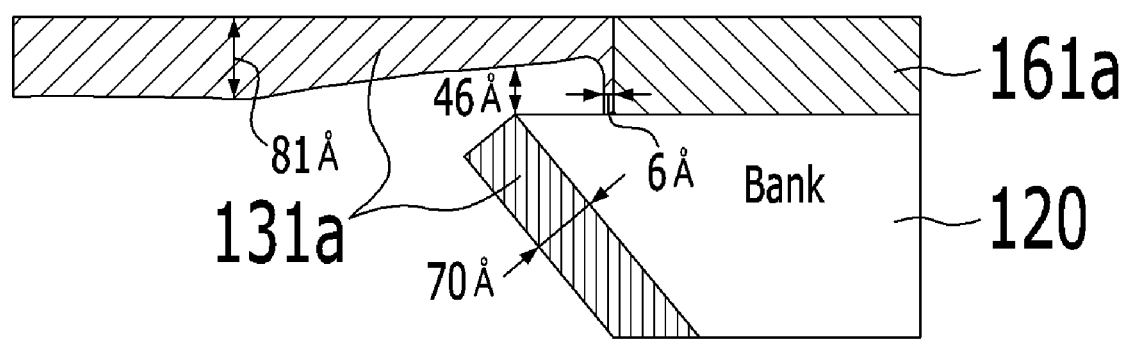

FIGS. 9A and 9B are views illustrating deposition states of a p-type layer on central and edge areas of a substrate, respectively, in an electroluminescent display device in accordance with a first test example.

In the first test example, a height h of a separation induction layer 161a is 100 Å, and a width difference d between an edge of the separation induction layer 161a and an edge of the bank 120 is 100 Å. In this case, as exemplarily shown in FIG. 9A, in the central area of the substrate 100, a p-type layer 131a on the surface of the substrate 100 is formed to have a thickness of about 69 Å, and the p-type layer 131a on the surface of the bank 120 is formed to have a thickness of about 53 Å. Further, it may be confirmed that a distance between the p-type layer 131a on the substrate 100 and the p-type layer 131a on the bank 120 at the lower end of the edge of the bank 120 is 66 Å, and thus, the p-type layer 131a on the substrate 100 and the p-type layer 131a on the bank 120 are separated from each other. As exemplarily shown in FIG. 9B, it may be confirmed that an injection angle of a p-type material with respect to the edge area of the substrate 100 is lower than the injection angle with respect to the central area of the substrate 100 in the first test example, and thus, the p-type material is deeply supplied close to the separation induction layer 161*a* and an area under the bank 120. It may be confirmed that, in the edge area of the substrate 100, the p-type layer 131*a* on the surface of the substrate 100 is formed to have a greater thickness of about 81 Å than the thickness of the p-type layer 131*a* formed in the central area of the substrate 100, and the p-type layer 131*a* is formed on the entire side surface of the separation induction layer 161*a*. It may be confirmed that the p-type layer 131*a* on the side surface of the separation induction layer 161*a* is formed to have a thickness of 6 Å. It may be confirmed that a distance between the p-type layer 131*a* on the substrate 100 and the p-type layer 131*a* on the side surface of the bank 120 is about 46 Å and thus the p-type layer 131*a* on the substrate 100 and the p-type layer 131*a* on the bank 120 in the edge area of the substrate 100 are separated from each other.

Figure 10A:
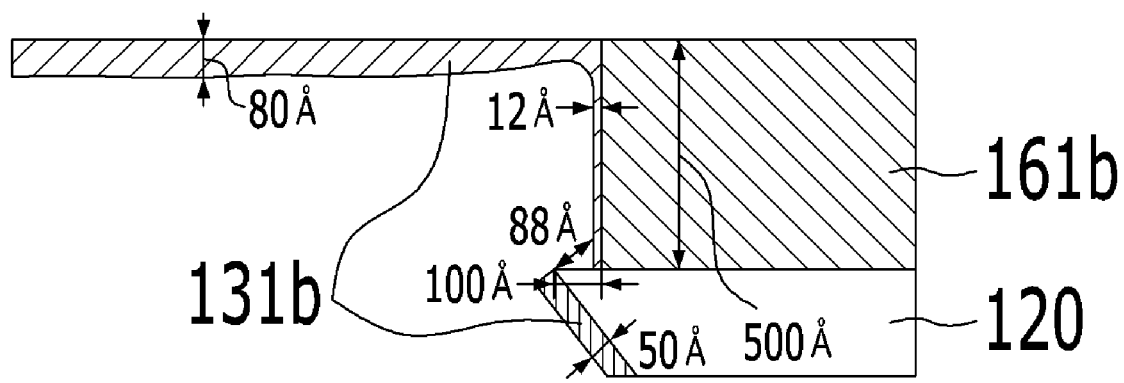
FIGS. 10A and 10B are views illustrating deposition states of a p-type layer on central and edge areas of a substrate, respectively, in an electroluminescent display device in accordance with a second test example.
Figure 10B:
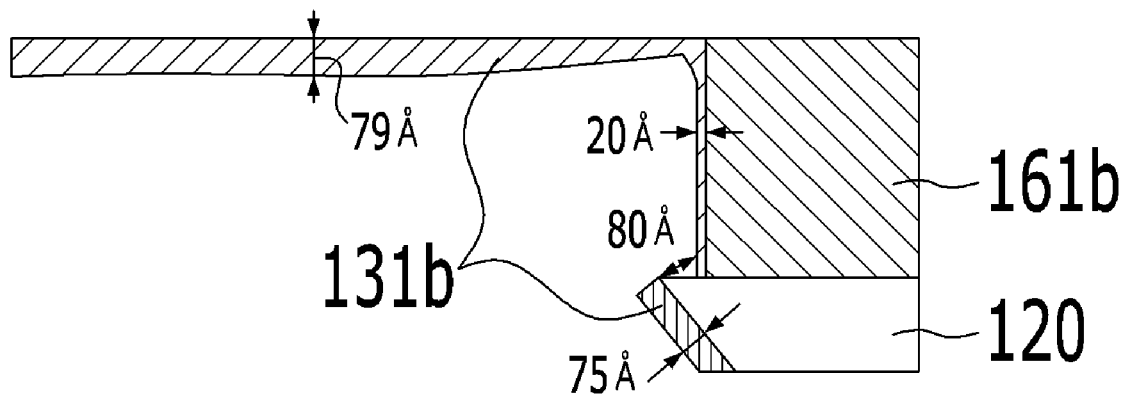

FIGS. 10A and 10B are views illustrating deposition states of a p-type layer on central and edge areas of a substrate, respectively, in an electroluminescent display device in accordance with a second test example.

In the second test example, a height h of a separation induction layer 161*b* is 500 Å, and a width difference d between the separation induction layer 161*b* and one side of the bank 120 is 100 Å. In this case, as exemplarily shown in FIG. 10A, in the central area of the substrate 100, a p-type layer 131*b* on the surface of the substrate 100 is formed to have a thickness of about 80 Å, and the p-type layer 131*b* on the surface of the bank 120 is formed to have a thickness of about 50 Å. Further, it may be confirmed that a distance between the p-type layer 131*b* on the substrate 100 and the p-type layer 131*b* on the bank 120 at the lower end of the edge of the bank 120 is 88 Å and thus the p-type layer 131*b* on the substrate 100 and the p-type layer 131*b* on the bank 120 are separated from each other. As exemplarily shown in FIG. 10B, an injection angle of a p-type material with respect to the edge area of the substrate 100 is lower than the injection angle with respect to the central area of the substrate 100 in the second test example, and thus the p-type material is deeply supplied close to the separation induction layer 161*b* and the p-type layer 131*b* is formed on the entire side surface of the separation induction layer 161*b*. However, in this case, the thickness of the separation induction layer 161*b* is large, and the p-type layer 131*b* deposited on the surface of the substrate 100 in the edge area of the substrate 100 is formed to have a thickness of about 79 Å, which is less than a thickness of the p-type layer 131*a* on the surface of the substrate 100 in the edge area of the substrate in the first test example. The p-type layer 131*b* on the side surface of the separation induction layer 161*b* is formed to have a thickness of 20 Å. In this case, it may be confirmed that a distance between the p-type layer 131*a* on the side surface of the separation induction layer 161*b* on the substrate 100 and the p-type layer 131*a* on the side surface of the bank 120 is about 80 Å, and thus, the p-type layer 131*a* on the substrate 100 and the p-type layer 131*a* on the bank 120 in the edge area of the substrate 100 are separated from each other.

Figure 11A:
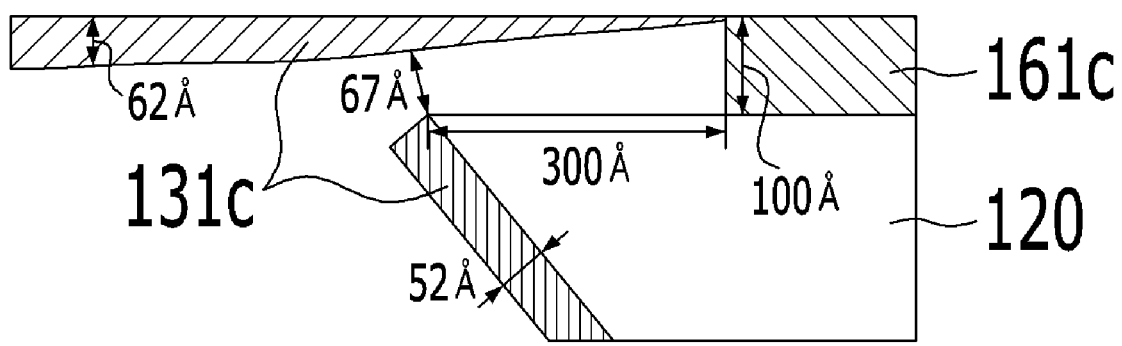
FIGS. 11A and 11B are views illustrating deposition states of a p-type layer on central and edge areas of a substrate, respectively, in an electroluminescent display device in accordance with a third test example.
Figure 11B:
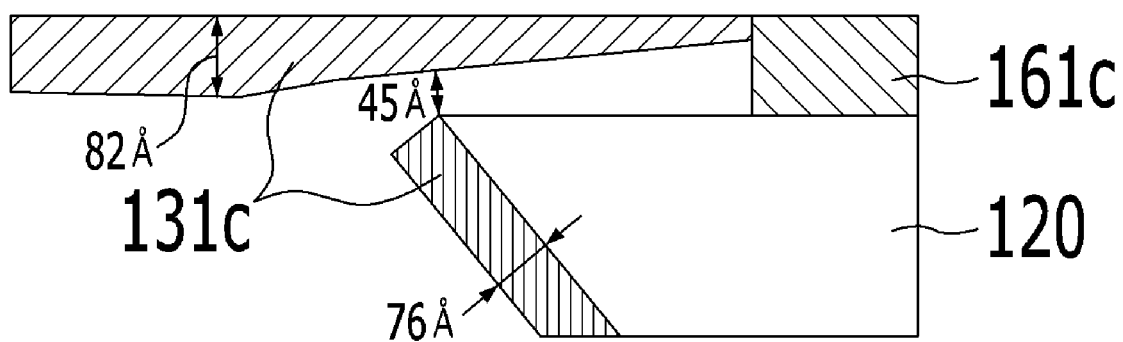

FIGS. 11A and 11B are views illustrating deposition states of a p-type layer on central and edge areas of a substrate, respectively, in an electroluminescent display device in accordance with a third test example.

In the third test example, a height h of a separation induction layer 161*c* is 100 Å, and a width difference d between the separation induction layer 161*c* and one side of the bank 120 is 300 Å. In this case, as exemplarily shown in FIG. 11A, in the central area of the substrate 100, a p-type layer 131*c* on the surface of the substrate 100 is formed to have a thickness of about 62 Å, and the p-type layer 131*c* on the surface of the bank 120 is formed to have a thickness of about 52 Å. Further, it may be confirmed that a distance between the p-type layer 131*c* on the substrate 100 and the p-type layer 131*c* on the bank 120 at the lower end of the edge of the bank 120 is 67 Å, and thus, the p-type layer 131*c* on the substrate 100 and the p-type layer 131*c* on the bank 120 are separated from each other. As exemplarily shown in FIG. 11B, an injection angle of a p-type material with respect to the edge area of the substrate 100 is lower than the injection angle with respect to the central area of the substrate 100 in the third test example, and thus, it may be confirmed that a p-type material is deeply supplied close to the separation induction layer 161*c* and the p-type layer 131*c* on the surface of the substrate 100 in the edge area of the substrate 100 is formed to have a thickness of 82 Å which is greater than that of the p-type layer 131*c* on the surface of the substrate 100 in the central area of the substrate 100. However, coverage of the side surface of the separation induction layer 161*c* by the p-type material is minimal, as compared to the first and second test examples, and thus, the p-type layer 131*c* is not formed on or does not cover the entire the side surface of the separation induction layer 161*c*. In this case, it may be confirmed that a distance between the p-type layer 131*c* on the surface of the substrate 100 and the p-type layer 131*c* on the side surface of the bank 120 is about 45 Å and thus the p-type layer 131*a* on the substrate 100 and the p-type layer 131*a* on the bank 120 in the edge area of the substrate 100 are separated from each other.

Figure 12A:
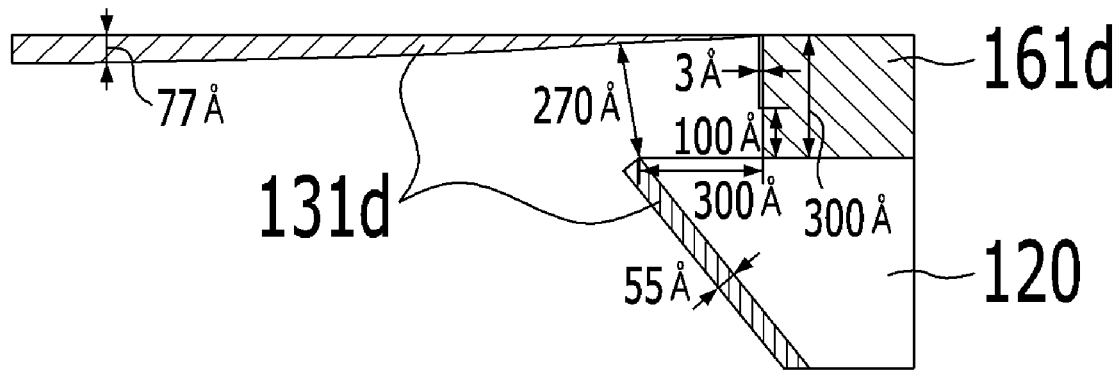
FIGS. 12A and 12B are views illustrating deposition states of a p-type layer on central and edge areas of a substrate, respectively, in an electroluminescent display device in accordance with a fourth test example.
Figure 12B:
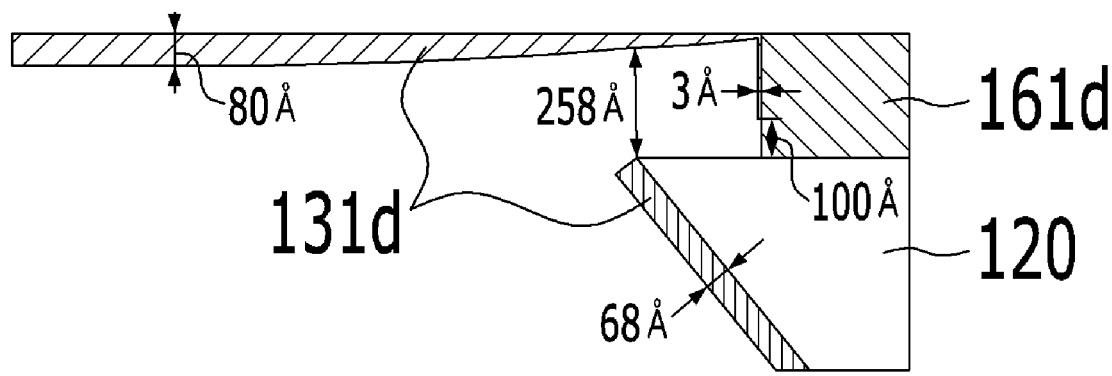

FIGS. 12A and 12B are views illustrating deposition states of a p-type layer on central and edge areas of a substrate, respectively, in an electroluminescent display device in accordance with a fourth test example.

In the fourth test example, a height h of a separation induction layer 161*d* is 300 Å, and a width difference d between the separation induction layer 161*d* and one side of the bank 120 is 300 Å. In this case, as exemplarily shown in FIG. 12A, in the central area of the substrate 100, a p-type layer 131*d* on the surface of the substrate 100 is formed to have a thickness of about 77 Å, and the p-type layer 131*d* on the surface of the bank 120 is formed to have a thickness of about 55 Å. Further, it may be confirmed that a distance between the p-type layer 131*d* on the substrate 100 and the p-type layer 131*d* on the bank 120 at the lower end of the edge of the bank 120 is 270 Å, and thus, the p-type layer 131*d* on the substrate 100 and the p-type layer 131*d* on the bank 120 are separated from each other. In the central area of the substrate 100, the p-type layer 131*d* on a part of the side surface of the separation induction layer 161*d* is formed to have a thickness of about 3 Å, which is $1/100$ of the total thickness of the separation induction layer 161*d*, and is not connected to the p-type layer 131*d* formed on the bank 120. As exemplarily shown in FIG. 12B, an injection angle of a p-type material with respect to the edge area of the substrate 100 is less than the injection angle with respect to the central area of the substrate 100 in the fourth test example, and thus, the p-type material is supplied close to the separation induction layer 161*d* and the p-type layer 131*d* on the surface of the substrate 100 in the edge area of the substrate 100 is formed to have a thickness of 80 Å, which is greater than that of the p-type layer 131*d* on the surface of the substrate 100 in the central area of the substrate 100. Further, the p-type layer 131*d* is deposited on a part of the side surface of the separation induction layer 161*d* so as to have a thickness of about 3 Å. In this case, it may be confirmed that a distance between the p-type layer 131d on the substrate 100 and the p-type layer 131d on the side surface of the bank 120 is about 258 Å, and thus, the p-type layer 131d on the substrate 100 and the p-type layer 131d on the bank 120 in the edge area of the substrate 100 are separated from each other.

Through the above test examples, it may be confirmed that the separation induction layers 161a, 161b, 161c, 161d are formed inside the edge of the lower end of the bank 120 and have a thickness greater than thicknesses of the corresponding p-type layers 131a, 131b, 131c, 131d to be formed, and thus, the p-type layers 131a, 131b, 131c, 131d are separated at the edge of the lower end of the bank 120. It may be understood that, when the thickness of the separation induction layer 161 is about 1.2 times or more that of the p-type layer 131, the p-type layer 131 may be separated at the edge of the lower end of the bank 120. The thickness of the separation induction layer 161 is set to about 4 times or less that of the p-type layer 131. The reason why the thickness of the separation induction layer 161 is set to about 4 times or less than that of the p-type layer 131 is that, when the separation induction layer 161 becomes thick, the p-type layer 131 may be theoretically separated but, if the separation induction layer 161 remains on the substrate 100, the separation induction layer 161 does not have an optical or electrical function, and thus, has a thickness of a designated value or less. The total thickness of the separation induction layer 161 may be 500 Å or less, without being limited thereto and may be any other thickness as desired.

The above-described substrate 100 in accordance with the present disclosure includes thin film transistors formed at the lower portion thereof. For example, a configuration of an electroluminescent display device including thin film transistors will be described below.

First, shapes of common layers formed after formation of the p-type layer separated according to the subpixels of the present disclosure will be described.

Figure 13:
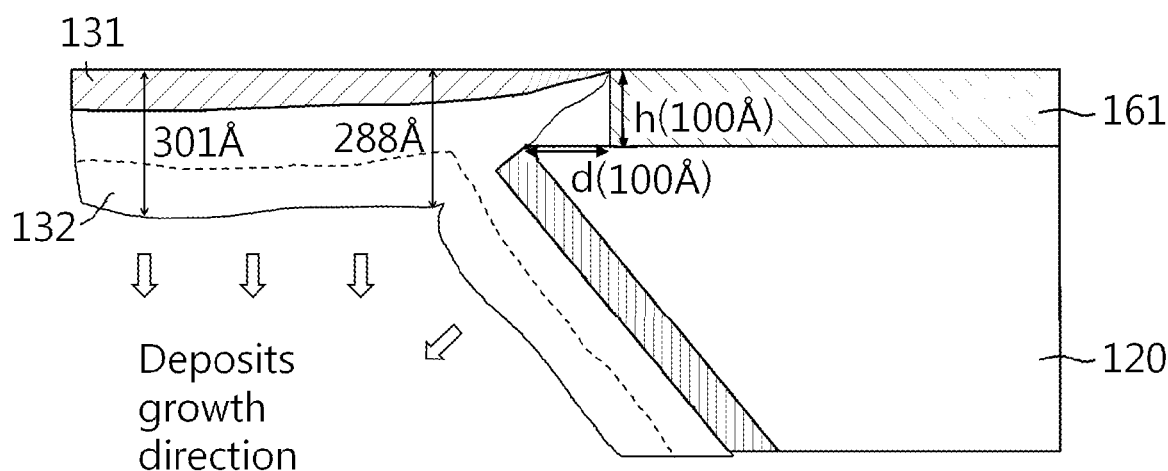
FIG. 13 is a simulated cross-sectional view illustrating a formation state of a hole transport layer, after formation of a separated p-type layer.

FIG. 13 is a simulated cross-sectional view illustrating a formation state of a hole transport layer, after formation of a separated p-type layer.

In a structure in which a height h of the separation induction layer 161 is 100 Å and a width difference d between the separation induction layer 161 and one side of the bank 120 is 100 Å, as in the above-described first test example, connection of the hole transport layer after formation of the separated p-type layer will be described.

Although the thickness of the p-type layer 131 formed on the surface of the substrate 100 is varied, there is a thickness deviation of the p-type layer 131, and it may be confirmed that, when a hole transport layer 132 is formed to have a thickness of about 150 Å or more, connection of a hole transporting material even at the lower end of the bank 120 is possible.

The hole transport layer 132 is formed to have a thickness which is about 3 times or more that of the p-type layer 131 so as to have a function of transporting holes to an emission layer. In the illustrated example, the p-type layer 131 is formed to have a target thickness of 80 Å, and the hole transport layer 132 is formed to have a target thickness of 220 Å. It may be confirmed that, although the separation induction layer 162 is formed at the lower end of the bank 120 so as to have a width difference with the bank 120, the hole transport layer 132 is continuously formed on the separated p-type layer 131 so that the hole transport layer 132 deposited on the corner of the lower end of the bank 120, for example, on the surface of the substrate 100, and the hole transport layer 132 deposited on the side surface of the bank 120 located on the substrate 100 are connected.

Therethrough, it may be confirmed that a common layer not causing side leakage current other than the p-type layer 131, for example, the hole transport layer 132, may be formed in the active area of the substrate 100 without disconnection.

Figure 14:
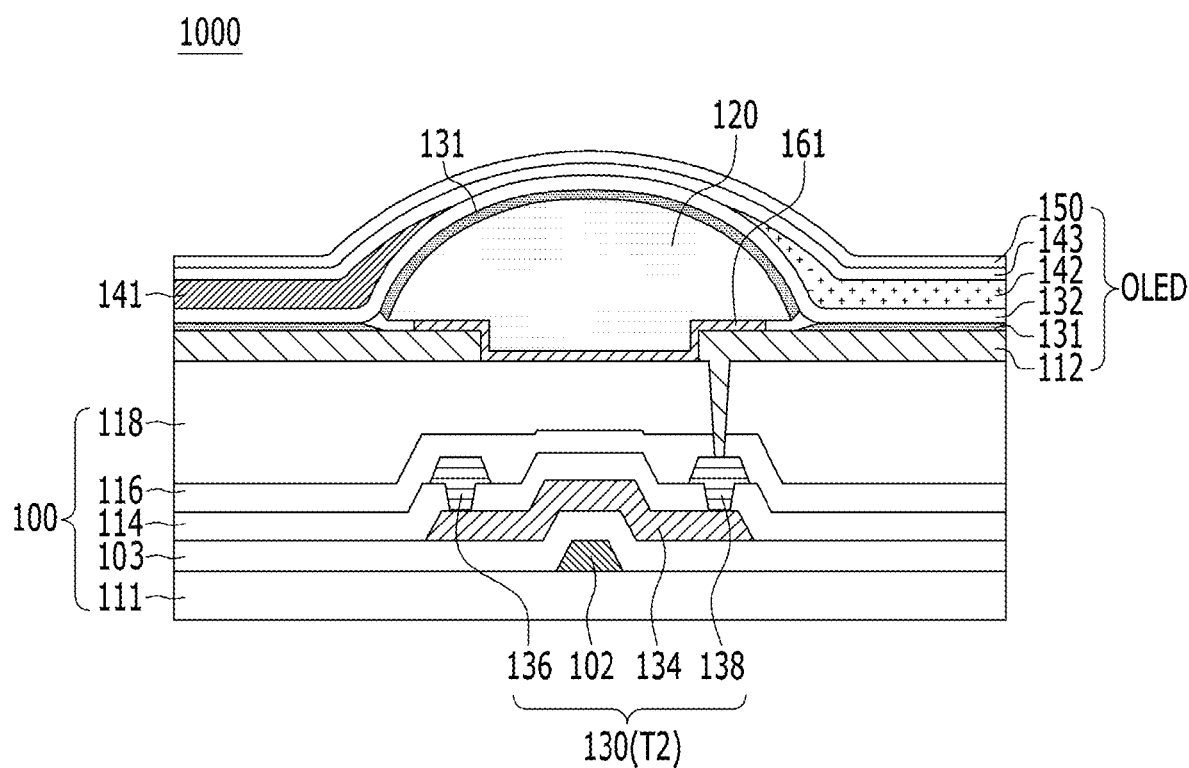
FIG. 14 is a cross-sectional view illustrating connection between an electroluminescent diode and a driving thin film transistor, in the electroluminescent display device in accordance with the second embodiment of the present disclosure.

FIG. 14 is a cross-sectional view illustrating connection between an organic light emitting diode and a driving thin film transistor, in the electroluminescent display device in accordance with the second embodiment of the present disclosure.

The organic light emitting diode (OLED) is connected to the driving thin film transistor T2 130 located at the lower portion of the substrate 100.

The substrate 100 including a plurality of thin film transistors necessary to drive the driving thin film transistor T2 and the organic light emitting diode (OLED) is referred to as a thin film transistor array substrate.

As exemplarily shown in FIG. 14, the driving thin film transistor T2 130 includes a gate electrode 102 located in a designated region on a base material 111, a gate insulating film 103 configured to cover the gate electrode 102, a semiconductor layer 134 provided on the gate insulating film 103 to overlap the gate electrode 102, and a source electrode 136 and a drain electrode 138 connected to both sides of the semiconductor layer 134.

The semiconductor layer 134 may be formed of, for example, amorphous silicon, polysilicon, an oxide semiconductor, or the like, and be provided by stacking different kinds of semiconductor layers.

An interlayer insulating film 114 may be provided between the semiconductor layer 134 and the source and drain electrodes 136 and 138, except for connection parts.

An inorganic protective film 116 and a planarization film 118 are formed to cover the driving thin film transistor T2 130, and connection holes connected to the first electrode 112 of the organic light emitting diode (OLED) may be provided by exposing a designated part of the drain electrode 138 by selectively removing the planarization film 118 and the inorganic protective film 116.

The organic light emitting diode (OLED) of FIG. 14 has the shape described in the second embodiment of the present disclosure shown in FIG. 5 and a detailed description thereof will thus be omitted. The separation induction layer 162 partially fills a space between adjacent first electrodes 112, for example, between adjacent subpixels. In other words, as shown in FIG. 14, electrodes 112 of the sub pixels are separated by a space. The separation induction layer 162 is disposed on both of the adjacent subpixels and in the space. As such, the separation induction layer 162 extends along a first electrode 112, the space, and a second electrode 112.

As another example, the organic light emitting diode (OLED) connected to the driving thin film transistor 130 (T2) may have the shape described in the first embodiment of the present disclosure shown in FIG. 2. For example, the separation induction layer 161 may be located between the bank 120 and the first electrode 112 and configured to vertically space the lower end 157 of the bank 120 from the upper surface of the first electrode 112, a p-type layer 131 on the surface of the bank 120 and the emission part. In this embodiment, the separation induction layer 161 is separated at the lower end 157 of the bank 120, and at least one common layer 132, 143, 150 provided on the p-type layer 131. In other words, the separation induction layer 161 has a first portion disposed on a first one of the electrodes 112 and a second portion disposed on a second, adjacent one of the electrodes 112, with the bank 120 extending into the space between the electrodes 112 to contact the substrate 100, as shown in FIG. 2. Both the first and second embodiments may have separation effects of the p-type layer 131.

Figure 15:
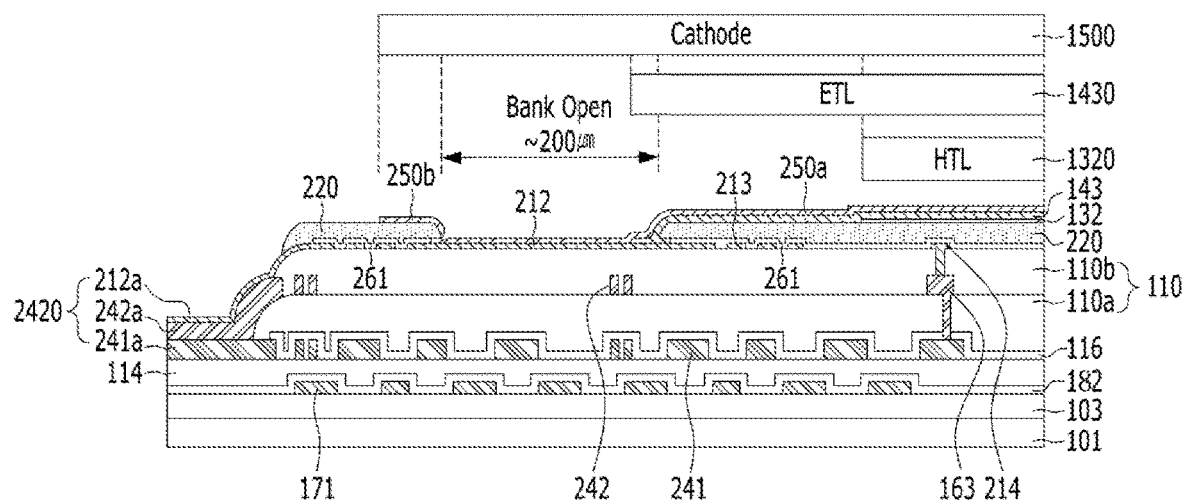
FIG. 15 is a cross-sectional view illustrating an electroluminescent display device in accordance with a third embodiment of the present disclosure.

FIG. 15 is a cross-sectional view illustrating an electroluminescent display device in accordance with a third embodiment of the present disclosure.

FIG. 15 illustrates a cross-sectional view passing a gate-in-panel (GIP) part at the outside of the active area AA of FIG. 1.

The electroluminescent display device in accordance with the third embodiment of the present disclosure is considered to prevent short circuit of an upper electrode, for example, a second electrode 250a, in a structure in which a separation induction layer 261 is provided under a bank 220 so as to be located inside the edge of the lower end of the bank 220 even in an edge area of a substrate.

In the edge area of the substrate, for example, in the non-display area NA, a hole transport layer 132, an electron transport layer 143 and an edge part of the second electrode 250a, which are formed in common, may be disposed. Each of the hole transport layer 132, the electron transport layer 143 and the second electrode 250a, which are sequentially provided in common on organic light emitting diodes (OLED) in the active area, is formed by depositing a corresponding organic material using a common mask provided with an opening corresponding to the entirety of the active area AA and some parts of the non-display area NA. The second electrode 250a which is connected to a lower wiring in the non-display area NA to receive a VSS signal protrudes to the outermost part of the non-display area NA, the electron transport layer 143 connected to the second electrode 250a is formed to have a smaller size than the second electrode 250a, and the hole transport layer 132 is formed to have a smaller size than the electron transport layer 143. In order to prevent the hole transport layer 132 from directly meeting the second electrode 250a in the non-display area NA, an opening 1430 of the common mask to form the electron transport layer (ETL) 143 may have a greater size than an opening 1320 of the common mask to form the hole transport layer (HTL) 132. An opening 1500 of the common mask to form the second electrode (Cathode) 250a has a greater size than the opening 1430 of the common mask to form the electron transport layer 143.

As exemplarily shown in FIG. 15, in the electroluminescent display device in accordance with the third embodiment of the present disclosure, in order to prevent short circuit of the second electrode 250a deposited on the substrate, the opening 1430 of the common mask to form the electron transport layer 143 may be set so that an extension of the electron transport layer 143 is provided within a bank hole via the side surface of the bank 220. Here, the second electrode 250b located close to a pad electrode 2420 is not directly connected to an electrode connection pattern 212 within the bank hole by a separation induction layer 261 provided within the bank hole. But the second electrode 250a formed to cover the electron transport layer 143 at the other side of the bank 220 is directly connected to the electrode connection pattern 212, the second electrode 250a and the pad electrode 2420 may be electrically connected. Therefore, a signal is applied to the second electrode 250a by the electrode connection pattern 212. Since the second electrode 250a is protruding to cover the electron transport layer 143, contact between the hole transport layer 132 having high interfacial resistance and the second electrode 250a may be prevented, the second electrode 250a may be stably deposited while covering the electron transport layer 143 having a gentle side part, and electrical stability of the display device may be reinforced. In this case, the extension of the electron transport layer 143 contacts with the second electrode 250a, in the bank hole, and a protruded part of the second electrode 250a directly contacts with the electrode connection pattern 212.

The second electrode 250a may have electron connection patterns 212, 213 and 214 located in the same layer as the first electrode 112 (Please see FIGS. 1 and 2. The first electrode 112 may be provided in each sub-pixel of Active Area AA) and thus be connected to the second electrode 250a, and some of the electron connection patterns 212, 213 and 214, for example, the electron connection pattern 214, may be connected to a source/drain metal wiring 163 provided thereunder to apply a VSS signal.

In the gate-in-panel (GIP) part, a plurality of gate metal patterns 171, which are spaced apart from each other, are patterned in the same layer as first lines GL, and a plurality of first source/drain metal patterns 241, which are spaced apart from each other, are patterned in the same layer as second lines DL.

At the end of the non-display area, first pad electrodes 241a are provided in the same layer as the first source/drain metal patterns 241, second pad electrodes 242a are provided in the same layer as second source/drain metal patterns 242, 163. The metal patterns 242, 163 may be disposed between an interlayer insulating layer 110a and another interlayer insulating layer 110b (which may be collectively referred to as an interlayer insulating structure 110) so as to be connected to the first pad electrodes 241a, third pad electrodes 212a are provided in the same layer as the first electrode 112 and the electrode connection pattern 212, 213 and 214, and the first, second and third pad electrodes 241a, 242a and 212a are connected to form the pad electrodes 2420 to which a ground signal or a VSS signal is applied.

The electroluminescent display device in accordance with the third embodiment of the present disclosure includes the separation induction layer 261 provided inside the lower end of the bank 220 in the non-display area, and allows the electron transport layer 143 to contact the side wall of the bank 220 and be formed at a part of the lower surface of the bank 220 at least in the non-display area, in order to prevent short circuit of the second electrode 250b of upper layers by vertical spacing between the electrode connection pattern 212 and the bank 220, thereby allowing the second electrode 250a subsequently formed to stably meet the electrode connection pattern 212 under the bank hole via the gentle electron transport layer 143 and conductively connecting the second electrode 250a to the first pad electrode 241a through the first source/drain metal patterns 241 via the electrode connection patterns 213, 214 provided in the same layer as the electrode connection pattern 212.

In this case the bank hole provided in the non-display area may overlap the opening 1430 of the common mask to form the electron transport layer 143.

Figure 16:
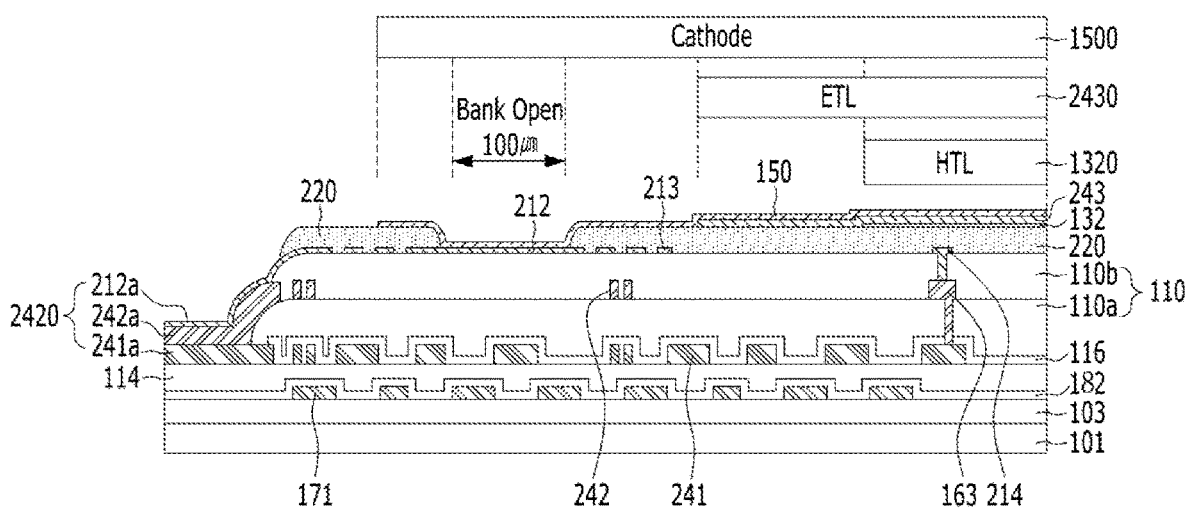
FIG. 16 is a cross-sectional view illustrating an electroluminescent display device in accordance with a fourth embodiment of the present disclosure.

FIG. 16 is a cross-sectional view illustrating an electroluminescent display device in accordance with a fourth embodiment of the present disclosure.

As exemplarily shown in FIG. 16, a separation induction layer is not formed under a bank 220 located in a non-display area, the bank 220 has an acute angle with the surface of the flat surface of a substrate, and thus a second electrode 150 is continuously formed on the surface of the bank 220 without disconnection in a bank hole. If the bank 220 has the acute angle, the bank 220 may have a regular tapered shape.

In this case, the second electrode 150 is connected to other elements around the bank 220 through electrode connection patterns 213 and is finally connected to a pad electrode 2420, and thus an opening 2430 of a common mask to form an electron transport layer 243 may be formed regardless of the position of the bank hole in the non-display area. For example, the bank hole and the opening 2430 of the common mask to form the electron transport layer 243 may be spaced apart from each other, as exemplarily shown in this figure, and, in this case, the second electrode 150 may stably receive a VSS signal through the pad electrode 2420 and a source/drain metal wiring 163 connected to the pad electrode 2420 to apply the VSS signal.

It is to be noted that although the present disclosure describes embodiments of the electroluminescent display device by using an organic light emitting display device as an example, but the present disclosure is not limited thereto. For example, the electroluminescent display device may be one of an inorganic light emitting display device, a micro-LED display device, a quantum-dot display device, and so on, in which the embodiments of the present disclosure may be similarly applied.

An electroluminescent display device in accordance with the present disclosure further includes a separation induction layer provided under a bank to be disposed inside the lower end of the bank, and thus separates a p-type layer formed to contact a first electrode into a part of the p-type layer formed on the first electrode and a part of the p-type layer formed on the bank due to the shape of the separation induction layer, thereby causing separation of the p-type layer between respective subpixels. Such separation of the p-type layer may be acquired by the separation induction layer which is formed inside the edge of the bank and has a related thickness with a target thickness of the p-type layer.

Further, the p-type layer formed of a material having high conductivity is separated between subpixels, and thus, formation of the p-type layer causing leakage current as a common layer may be carried out without change of a deposition mask. That is, turning-on of an adjacent pixel in a low luminance state is prevented due to prevention of leakage current, and thus, visibility may be improved.

Further, the electroluminescent display device may lower driving voltage through separation of a layer, causing leakage current, between the subpixels, and employ an emission layer driven at a low voltage.

Side leakage current may not be caused even if the concentration of a p-type dopant is increased, and element characteristics may be improved and thus the lifespan of the electroluminescent display device may be enhanced. Particularly, a material having a low threshold voltage but an enhanced lifespan may be applied to a hole transport layer, an auxiliary hole transport layer or the emission layer, and thus, the lifespan of the electroluminescent display device may be remarkably enhanced.

Interfacial bonding characteristics between the first electrode and the p-type layer may be improved by cleaning the first electrode before or after formation of the separation induction layer, point defects may be reduced, and the lifespan of the electroluminescent display device may be remarkably enhanced.

An electroluminescent display device in accordance with one embodiment of the present disclosure may include a substrate having a plurality of subpixels, a bank located at a boundary between the subpixels and configured to expose an emission part of each subpixel, a first electrode provided in each subpixel, a separation induction layer located between the bank and the first electrode and configured to vertically space the lower end of the bank adjacent to the emission part apart from the upper surface of the first electrode, a p-type layer located on the upper surface of the bank and the emission part and separated at the lower end of the bank, and at least one common layer provided on the p-type layer.

In accordance with the embodiment of the present disclosure, the at least one common layer may include a hole transport layer, an electron transport layer and a second electrode.

The electroluminescent display device in accordance with the embodiment of the present disclosure may further include at least one organic emission layer disposed between the hole transport layer and the electron transport layer and divided according to the respective subpixels.

In accordance with the embodiment of the present disclosure, the at least one organic emission layer may include a plurality of organic emission layers, and the electroluminescent display device may further include a charge generation layer located between the organic emission layers.

In accordance with the embodiment of the present disclosure, the p-type layer on the bank may be spaced apart and electrically isolated from the first electrode.

In accordance with the embodiment of the present disclosure, the p-type layer may include 5 wt % or less of a p-type dopant with respect to a hole transporting material.

In accordance with the embodiment of the present disclosure, the separation induction layer may be an inorganic insulating film.

In accordance with the embodiment of the present disclosure, the inorganic insulating film may include at least one of SiNx, SiOx, or SiOxNy.

In accordance with the embodiment of the present disclosure, the separation induction layer may have an edge corresponding to an edge of the first electrode, in an area overlapping the bank.

In accordance with the embodiment of the present disclosure, the separation induction layer may pass between adjacent first electrodes and overlap with edges of the adjacent first electrodes, in the area overlapping the bank.

In accordance with the embodiment of the present disclosure, the electroluminescent display device may further include a non-display area NA disposed in an edge area of the substrate, and the electron transport layer may have an extension configured to cover at least one side part of the bank so as to be disposed in an open region of the bank located in the non-display area.

In accordance with the embodiment of the present disclosure, the extension of the electron transport layer may contact with the second electrode in the open region of the bank. And a protruded part of the second electrode from the electron transport layer may contact with an electrode connection pattern.

In accordance with the embodiment of the present disclosure, the electrode connection pattern may be located in the same layer as the first electrode.

In accordance with the embodiment of the present disclosure, an extension of the hole transport layer is located inside the extension of the electron transport layer in the non-display area, and the edge of the extension of the hole transport layer does not overlap the open region of the bank in the non-display area.

In accordance with the embodiment of the present disclosure, a thickness of the separation induction layer may be 1.2 times to 4 times a thickness of the p-type layer.

In accordance with the embodiment of the present disclosure, the separation induction layer may be disposed inside the edge of the lower end of the bank by a width of 100 Å or more.

A method for manufacturing an electroluminescent display device in accordance with one embodiment of the preset disclosure includes forming a first electrode on a substrate, depositing a separation induction layer forming material on the substrate including the first electrode, forming a bank by applying a bank material to the separation induction layer forming material and patterning the bank material, and forming a separation induction layer by selectively removing the separation induction layer forming material from a region inside the bank.

In accordance with the embodiment of the present disclosure, the separation induction layer forming material may have higher etch selectivity ratio than the bank material.

As apparent from the above description, an electroluminescent display device in accordance with the present disclosure further includes a separation induction layer provided under a bank to be disposed inside the lower end of the bank, and thus separates a p-type layer formed to contact a first electrode into a part of the p-type layer formed on the first electrode and a part of the p-type layer formed on the bank due to the shape of the separation induction layer, thereby preventing leakage current.

The electroluminescent display device in accordance with the present disclosure separates the p-type layer formed of a material having high conductivity between subpixels and may thus prevent leakage current and turning-on of an adjacent subpixel in a low luminance state due to prevention of leakage current, thereby improving visibility.

The electroluminescent display device in accordance with the present disclosure may lower driving voltage through separation of a layer, causing leakage current, between the subpixels and employ an emission layer driven at a low voltage, and thus a display device driven at a low voltage may be provided.

The electroluminescent display device in accordance with the present disclosure may prevent leakage current even if the concentration of a p-type dopant is increased, and thus have improved element characteristics and an enhanced lifespan.

The electroluminescent display device in accordance with the present disclosure may improve interfacial bonding characteristics between the first electrode and the p-type layer due to cleaning of the first electrode before or after formation of the separation induction layer, and may thus reduce defects and have an enhanced lifespan.

It will be apparent to those skilled in the art that various modifications and variations can be made in the present disclosure without departing from the spirit or scope of the disclosure. Thus, it is intended that the present disclosure covers the modifications and variations of this disclosure provided they come within the scope of the appended claims and their equivalents.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An electroluminescent display device, comprising:
    a substrate having a plurality of subpixels;
    a bank located at a boundary between the subpixels and configured to expose an emission part of each subpixel;
    a first electrode in each subpixel;
    a separation induction layer between the bank and the first electrode and configured to vertically space a lower end of the bank adjacent to the emission part from an upper surface of the first electrode;
    a first portion of a p-type layer is on an upper surface of the bank and a second portion of the p-type layer is on the emission part, the first portion of the p-type layer is separated from the second portion of the p-type layer at the lower end of the bank; and
    at least one common layer on the p-type layer.

2. The electroluminescent display device according to claim 1, wherein the at least one common layer comprises a hole transport layer, an electron transport layer and a second electrode.

3. The electroluminescent display device according to claim 2, further comprising at least one organic emission layer disposed between the hole transport layer and the electron transport layer, the at least one organic emission layer is divided according to the respective subpixels.

4. The electroluminescent display device according to claim 3, wherein:
    the at least one organic emission layer comprises a plurality of organic emission layers; and
    the electroluminescent display device further comprises a charge generation layer between the organic emission layers.

5. The electroluminescent display device according to claim 1, wherein the first portion of the p-type layer on the bank is spaced apart and electrically isolated from the first electrode.

6. The electroluminescent display device according to claim 1, wherein the p-type layer contains 5% by weight or less of a p-type dopant in a hole transporting material.

7. The electroluminescent display device according to claim 1, wherein the separation induction layer is an inorganic insulating film.

8. The electroluminescent display device according to claim 7, wherein the inorganic insulating film comprises at least one of $SiN_x$, $SiO_x$, or $SiO_xN_y$.

9. The electroluminescent display device according to claim 1, wherein the separation induction layer has an edge corresponding to an edge of the first electrode, in an area overlapping the bank.

10. The electroluminescent display device according to claim 1, wherein the separation induction layer passes between adjacent first electrodes and overlaps with edges of the adjacent first electrodes in an area overlapping the bank.

11. The electroluminescent display device according to claim 2, further comprising a non-display area disposed in an edge area of the substrate,
    wherein the electron transport layer has an extension configured to cover at least one side part of the bank so as to be disposed in an open region of the bank located in the non-display area.

12. The electroluminescent display device according to claim 11,
    wherein the extension of the electron transport layer contacts the second electrode in the open region of the bank, and
    wherein an extended portion of the second electrode from the electron transport layer contacts an electrode connection pattern in the open region of the bank.

13. The electroluminescent display device according to claim 12, wherein the electrode connection pattern is located in the same layer as the first electrode.

14. The electroluminescent display device according to claim 11, wherein an extension of the hole transport layer is located inside the extension of the electron transport layer in the non-display area, and an edge of the extension of the hole transport layer does not overlap the open region of the bank in the non-display area.

15. The electroluminescent display device according to claim 1, wherein a thickness of the separation induction layer is 1.2 times to 4 times a thickness of the p-type layer.

16. The electroluminescent display device according to claim 1, wherein the separation induction layer is disposed inside an edge of the lower end of the bank by a width of 100 Å or more.

17. The electroluminescent display device according to claim 1, wherein the first electrode is disposed under the bank with the separation induction layer interposed therebetween.

18. The electroluminescent display device according to claim 1, wherein the separation induction layer is formed of a material having a higher etch selectivity ratio than that of a material of which the bank is formed.

19. The electroluminescent display device according to claim 1, wherein the at least one common layer is provided in the plurality of subpixels.

* * * * *